US008610604B2

(12) United States Patent
Glass et al.

(10) Patent No.: US 8,610,604 B2
(45) Date of Patent: Dec. 17, 2013

(54) COMPRESSION ALGORITHM INCORPORATING A FEEDBACK LOOP FOR DYNAMIC SELECTION OF A PREDEFINED HUFFMAN DICTIONARY

(75) Inventors: Lior Glass, Adi (IL); Giora Biran, Zichron-Yaakov (IL); Amit Golander, Tel-Aviv (IL)

(73) Assignee: International Business Machines Corporation, Armonk, NY (US)

( * ) Notice: Subject to any disclaimer, the term of this patent is extended or adjusted under 35 U.S.C. 154(b) by 82 days.

(21) Appl. No.: 13/304,326

(22) Filed: Nov. 24, 2011

(65) Prior Publication Data

US 2013/0135122 A1 May 30, 2013

Related U.S. Application Data

(63) Continuation-in-part of application No. 13/304,324, filed on Nov. 24, 2011.

(51) Int. Cl.
*H03M 7/30* (2006.01)
*H03M 7/40* (2006.01)

(52) U.S. Cl.
USPC .............................................. 341/51; 341/65

(58) Field of Classification Search
USPC ................................. 341/51, 65, 67
See application file for complete search history.

(56) References Cited

U.S. PATENT DOCUMENTS

| | | | | |
|---|---|---|---|---|
| 3,394,352 A | * | 7/1968 | Wernikoff et al. | ........ 358/426.12 |
| 4,546,342 A | * | 10/1985 | Weaver et al. | ................... 341/51 |
| 4,626,829 A | * | 12/1986 | Hauck | .............................. 341/63 |
| 5,528,628 A | * | 6/1996 | Park et al. | ...................... 375/240 |
| 5,848,195 A | | 12/1998 | Romriell | |
| 5,953,503 A | | 9/1999 | Mitzenmacher et al. | |
| 7,307,552 B2 | | 12/2007 | Ma et al. | |
| RE41,152 E | | 2/2010 | Reynar et al. | |
| 7,834,781 B2 | | 11/2010 | Biran et al. | |
| 2002/0009153 A1 | | 1/2002 | Jeon et al. | |
| 2004/0164882 A1 | | 8/2004 | Touyama et al. | |
| 2009/0228284 A1 | | 9/2009 | Moon et al. | |
| 2010/0281079 A1 | | 11/2010 | Marwah et al. | |

FOREIGN PATENT DOCUMENTS

JP  2008107615  5/2008

OTHER PUBLICATIONS

Peter Deutsch, "Deflate Compressed Data Format Specification version 1.3", May 1996.
Wikipedia, the free encyclopedia, "Deflate", Nov. 2011.
Wikipedia, the free encyclopedia, "Huffman coding", Nov. 2011.
Suzanne Rigler, "FPGA-Based Lossless Data Compression Using GNU Zip", 2007.

(Continued)

*Primary Examiner* — Howard Williams

(57) ABSTRACT

A system and method of selecting a predefined Huffman dictionary from a bank of dictionaries. The dictionary selection mechanism of the present invention effectively breaks the built-in tradeoff between compression ratio and compression rate for both hardware and software compression implementations. A mechanism is provided for automatically creating a predefined Huffman dictionary for a set of input files. The dictionary selection mechanism achieves high compression rate and ratio leveraging predefined Huffman dictionaries and provides a mechanism for dynamically speculating which predefined dictionary to select per input data block, thereby achieving close to a dynamic Huffman ratio at a static Huffman rate. In addition, a feedback loop is used to monitor the ongoing performance of the preset currently selected for use by the hardware accelerator. If the current preset is not optimal it is replaced with an optimal preset.

24 Claims, 9 Drawing Sheets

(56) References Cited

OTHER PUBLICATIONS

Cannane et al., "A Compression Scheme for Large Databases", Database Conference, 2000. ADC 2000, Proceedings. 11th Australasian, Publisher: IEEE, 2000.

Tharini et al., "An Efficient Data Gathering Scheme for Wireless Sensor Networks", European Journal of Scientific Research ISSN 1450-216X vol. 43 No. 1, pp. 148-155, Publisher: EuroJournals Publishing, Inc, 2010.

* cited by examiner

COMPRESSION ALGORITHM INCORPORATING A FEEDBACK LOOP FOR DYNAMIC SELECTION OF A PREDEFINED HUFFMAN DICTIONARY

PRIORITY CLAIM AND RELATED APPLICATIONS

The present application is a continuation-in-part of U.S. patent application Ser. No. 13/304,324, entitled "COMPRESSION ALGORITHM INCORPORATING DYNAMIC SELECTION OF A PREDEFINED HUFFMAN DICTIONARY", which is filed on the same date of the present application, and incorporated herein by reference in its entirety. The present application also is related to and claims the benefit of copending U.S. patent application Ser. No. 13/304,327, entitled "COMPRESSION ALGORITHM INCORPORATING AUTOMATIC GENERATION OF A BANK OF PREDEFINED HUFFMAN DICTIONARIES", filed on the same date and which is assigned to the assignee of the present invention and incorporated herein by reference in their entirety.

FIELD OF THE INVENTION

The present invention relates to the field of data compression, and more particularly relates to a system and method of providing a feedback loop in a method of dynamically selecting a predefined Huffman dictionary from a bank of dictionaries.

BACKGROUND OF THE INVENTION

The explosion of data, both in motion (e.g., network) and at rest (e.g., storage), raises the need for better compression solutions. Currently, the networking industry uses compression to lower the network bandwidth requirements for growing portions of the internet traffic. Recently, the primary storage industry started using compression to lower the exponentially growing storage capacity requirements. Huffman encoding is a key part of standard compression algorithms It has two versions, one for optimal quality (e.g., ratio) and the other for optimal performance (e.g., rate).

SUMMARY OF THE INVENTION

There is therefore provided in accordance with the invention, a method of selecting a Huffman dictionary from a bank of predefined Huffman dictionaries using feedback, said method comprising selecting a predefined dictionary for use with a hardware encoder from said bank of predefined dictionaries in accordance with a predefined criteria, for each block of input data, monitoring the performance of said selected predefined dictionary as compared to other predefined dictionaries including static Huffman, and if said selected predefined dictionary is found not to be optimal, the current block ends and the subsequent blocks use an alternative SHT or predefined dictionary from said bank of predefined dictionaries for replacement thereof.

There is also provided in accordance with the invention, a method of implementing a feedback loop for selecting a preset Huffman dictionary from a bank of predefined Huffman dictionaries for use in a hardware data encoder, said method comprising for each block of input data, performing encoding using a plurality of encoders corresponding to said bank of predefined dictionaries and counting the frequency appearances of literals, lengths and distances calculated therein, speculatively selecting one of said encoders and generating encoded output data, monitoring the performance of said selected encoder as compared to other encoders including static Huffman, and if the encoder corresponding to lowest size is not the currently selected encoder, then ending the current block and choosing the lowest size encoder to be the new optimal encoder.

There is further provided in accordance with the invention, a feedback loop for selecting a preset Huffman dictionary from a bank of predefined Huffman dictionaries for use in a hardware data encoder, comprising a repetition removal encoder operative to count the frequency of appearances of literals, lengths and distances in an input data block, a plurality of preset encoders and a static Huffman encoder, a preset selector operative to speculatively choose one of said preset encoders, and a feedback loop circuit operative to count the length of symbols output by each preset encoder, and if the preset encoder corresponding to the lowest length is not the currently selected encoder, then end current block and said preset selector operative to change its choice of optimal preset encoder to the preset encoder corresponding to the lowest length.

There is also provided in accordance with the invention, a feedback loop for selecting a preset Huffman dictionary from a bank of predefined Huffman dictionaries for use in a hardware data encoder, comprising a repetition removal encoder operative to count the frequency of appearances of literals, lengths and distances in an input data block, a plurality of preset encoders and a static Huffman encoder, a preset selector operative to speculatively choose one of a plurality of preset encoders, and a feedback loop circuit operative to apply multiple predefined analyzing schemes on the data output from said repetition removal encoder so as to evaluate the efficiency of the selected preset encoder, and if the preset encoder corresponding to the lowest size is not the currently selected encoder, then said preset selector operative to change its choice of optimal preset encoder to the preset encoder corresponding to the highest grade.

BRIEF DESCRIPTION OF THE DRAWINGS

The invention is herein described, by way of example only, with reference to the accompanying drawings, wherein.

DETAILED DESCRIPTION OF THE INVENTION

Figure 1:
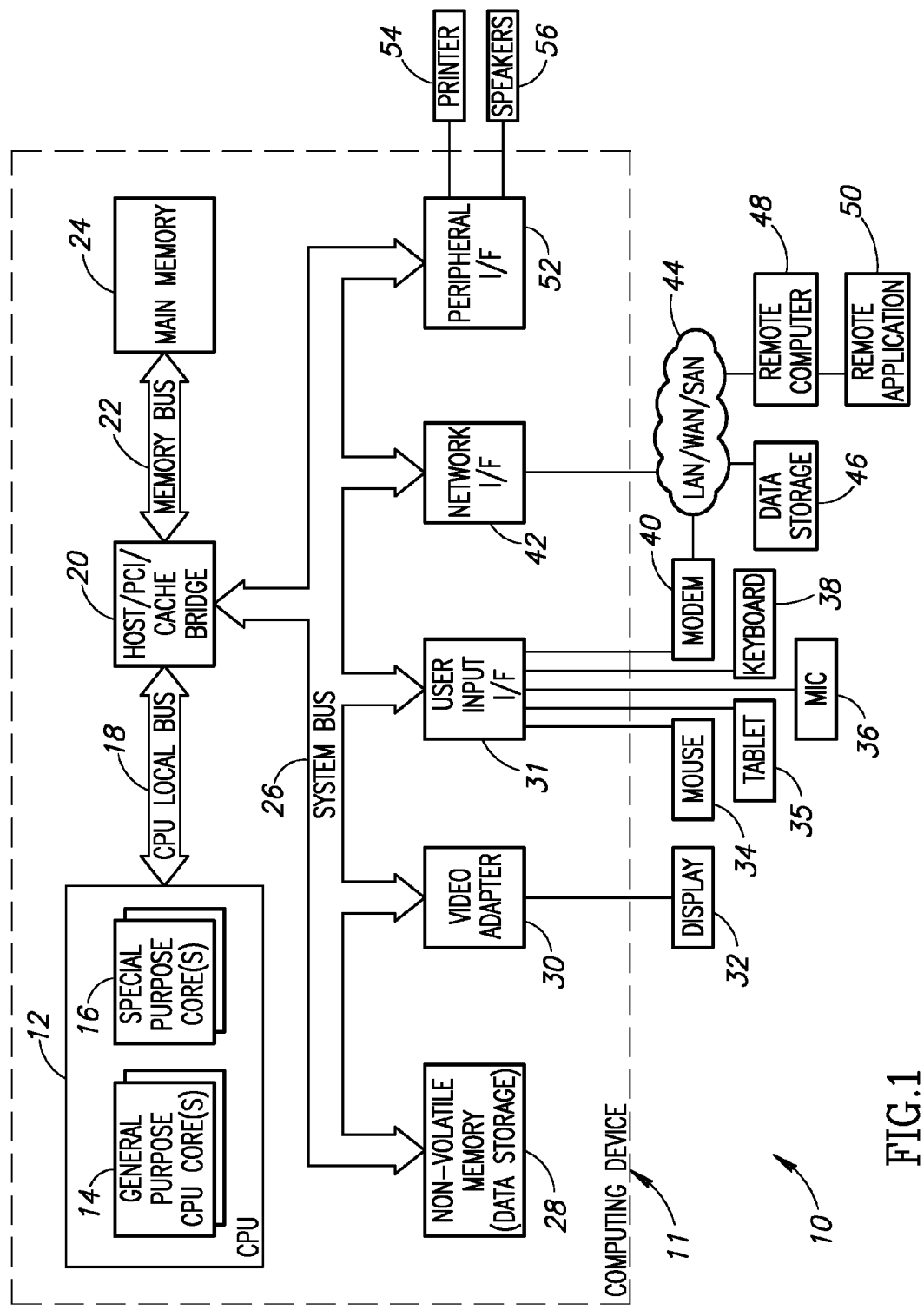
FIG. 1 is a block diagram illustrating an example computer processing system adapted to implement the electronic catalog system of the present invention.

As will be appreciated by one skilled in the art, the present invention may be embodied as a system, method, computer program product or any combination thereof. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

The invention may be described in the general context of computer-executable instructions, such as program modules, being executed by a computer. Generally, program modules include routines, programs, objects, components, data structures, etc. that performs particular tasks or implement particular abstract data types. The invention may also be practiced in distributed computing environments where tasks are performed by remote processing devices that are linked through a communications network. In a distributed computing environment, program modules may be located in both local and remote computer storage media including memory storage devices.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain or store the program for use by or in connection with the instruction execution system, apparatus, or device.

Computer program code for carrying out operations of the present invention may be written in any combination of one or more programming languages, including an object oriented programming language such as Java, Smalltalk, C++, C# or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented or supported by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The invention is operational with numerous general purpose or special purpose computing system environments or configurations. Examples of well-known computing systems, environments, and/or configurations that may be suitable for use with the invention include, but are not limited to, personal computers, server computers, cloud computing, hand-held or laptop devices, multiprocessor systems, microprocessor, microcontroller or microcomputer based systems, set top boxes, programmable consumer electronics, ASIC or FPGA core, DSP core, network PCs, minicomputers, mainframe computers, distributed computing environments that include any of the above systems or devices, and the like.

A block diagram illustrating an example computer processing system adapted to implement the electronic catalog system of the present invention is shown in FIG. 1. The exemplary computer processing system, generally referenced 10, for implementing the invention comprises a general purpose computing device 11. Computing device 11 comprises central processing unit (CPU) 12, host/PIC/cache bridge 20 and main memory 24.

The CPU 12 comprises one or more general purpose CPU cores 14 and optionally one or more special purpose cores 16 (e.g., DSP core, floating point, etc.). The one or more general purpose cores execute general purpose opcodes while the special purpose cores executes functions specific to their purpose. The CPU 12 is coupled through the CPU local bus 18 to a host/PCI/cache bridge or chipset 20. A second level (e.g., L2) cache memory (not shown) may be coupled to a cache controller in the chipset. For some processors, the external cache may comprise an L1 or first level cache. The bridge or chipset 20 couples to main memory 24 via memory bus 20. The main memory comprises dynamic random access memory (DRAM) or extended data out (EDO) memory, or other types of memory such as ROM, static RAM, flash, and non-volatile static random access memory (NVSRAM), bubble memory, etc.

The computing device 11 also comprises various system components coupled to the CPU via system bus 26 (e.g., PCI).

The host/PCI/cache bridge or chipset 20 interfaces to the system bus 26, such as peripheral component interconnect (PCI) bus. The system bus 26 may comprise any of several types of well-known bus structures using any of a variety of bus architectures. Example architectures include Industry Standard Architecture (ISA) bus, Micro Channel Architecture (MCA) bus, Enhanced ISA (EISA) bus, Video Electronics Standards Associate (VESA) local bus and Peripheral Component Interconnect (PCI) also known as Mezzanine bus.

Various components connected to the system bus include, but are not limited to, non-volatile memory (e.g., disk based data storage) 28, video/graphics adapter 30 connected to display 32, user input interface (I/F) controller 31 connected to one or more input devices such mouse 34, tablet 35, microphone 36, keyboard 38 and modem 40, network interface controller 42, peripheral interface controller 52 connected to one or more external peripherals such as printer 54 and speakers 56. The network interface controller 42 is coupled to one or more devices, such as data storage 46, remote computer 48 running one or more remote applications 50, via a network 44 which may comprise the Internet cloud, a local area network (LAN), wide area network (WAN), storage area network (SAN), etc. A small computer systems interface (SCSI) adapter (not shown) may also be coupled to the system bus. The SCSI adapter can couple to various SCSI devices such as a CD-ROM drive, tape drive, etc.

The non-volatile memory 28 may include various removable/non-removable, volatile/nonvolatile computer storage media, such as hard disk drives that reads from or writes to non-removable, nonvolatile magnetic media, a magnetic disk drive that reads from or writes to a removable, nonvolatile magnetic disk, an optical disk drive that reads from or writes to a removable, nonvolatile optical disk such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like.

A user may enter commands and information into the computer through input devices connected to the user input interface 31. Examples of input devices include a keyboard and pointing device, mouse, trackball or touch pad. Other input devices may include a microphone, joystick, game pad, satellite dish, scanner, etc.

The computer 11 may operate in a networked environment via connections to one or more remote computers, such as a remote computer 48. The remote computer may comprise a personal computer (PC), server, router, network PC, peer device or other common network node, and typically includes many or all of the elements described supra. Such networking environments are commonplace in offices, enterprise-wide computer networks, intranets and the Internet.

When used in a LAN networking environment, the computer 11 is connected to the LAN 44 via network interface 42. When used in a WAN networking environment, the computer 11 includes a modem 40 or other means for establishing communications over the WAN, such as the Internet. The modem 40, which may be internal or external, is connected to the system bus 26 via user input interface 31, or other appropriate mechanism.

The computing system environment, generally referenced 10, is an example of a suitable computing environment and is not intended to suggest any limitation as to the scope of use or functionality of the invention. Neither should the computing environment be interpreted as having any dependency or requirement relating to any one or combination of components illustrated in the exemplary operating environment.

In one embodiment, the software adapted to implement the system and methods of the present invention can also reside in the cloud. Cloud computing provides computation, software, data access and storage services that do not require end-user knowledge of the physical location and configuration of the system that delivers the services. Cloud computing encompasses any subscription-based or pay-per-use service and typically involves provisioning of dynamically scalable and often virtualized resources. Cloud computing providers deliver applications via the internet, which can be accessed from a web browser, while the business software and data are stored on servers at a remote location.

In another embodiment, software adapted to implement the system and methods of the present invention is adapted to reside on a computer readable medium. Computer readable media can be any available media that can be accessed by the computer and capable of storing for later reading by a computer a computer program implementing the method of this invention. Computer readable media includes both volatile and nonvolatile media, removable and non-removable media. By way of example, and not limitation, computer readable media may comprise computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by a computer. Communication media typically embodies computer readable instructions, data structures, program modules or other data such as a magnetic disk within a disk drive unit. The software adapted to implement the system and methods of the present invention may also reside, in whole or in part, in the static or dynamic main memories or in firmware within the processor of the computer system (e.g., within microcontroller, microprocessor or microcomputer internal memory).

Other digital computer system configurations can also be employed to implement the system and methods of the present invention, and to the extent that a particular system configuration is capable of implementing the system and methods of this invention, it is equivalent to the representative digital computer system of FIG. 1 and within the spirit and scope of this invention.

Once they are programmed to perform particular functions pursuant to instructions from program software that implements the system and methods of this invention, such digital computer systems in effect become special purpose computers particular to the method of this invention. The techniques necessary for this are well-known to those skilled in the art of computer systems.

It is noted that computer programs implementing the system and methods of this invention will commonly be distributed to users on a distribution medium such as floppy disk, CDROM, DVD, flash memory, portable hard disk drive, etc. From there, they will often be copied to a hard disk or a similar intermediate storage medium. When the programs are to be run, they will be loaded either from their distribution medium or their intermediate storage medium into the execution memory of the computer, configuring the computer to act in accordance with the method of this invention. All these operations are well-known to those skilled in the art of computer systems.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or by combinations of special purpose hardware and computer instructions.

Deflate is the most popular lossless data compression algorithm defined in RFC 1951. It uses a combination of the Lempel-Ziv algorithm (LZ77) that eliminates repetitions and Huffman coding. Huffman encoding uses a variable-length code table based on entropy to encode source symbols. It is defined either as either Static or Dynamic. In Static Huffman coding, each literal or distance is encoded using a fixed table (SHT) that is defined in the RFC. In Dynamic Huffman coding, however, special coding tables (DHT) are constructed to better suit the statistics of the data being compressed. In most cases, using DHT achieves better compression ratio (e.g., quality) when compared to SHT, at the expense of degrading the compression rate (e.g., performance) and adding design complexity.

Using Dynamic Huffman encoding increases the compression ratio in comparison to using Static Huffman encoding, but is typically time consuming and requires complex hardware. One solution to improve the compression ratio while maintaining good performance is to analyze the first part of the incoming data stream and speculatively select a predefined preset dictionary to be used on the entire data (instead of a generic static dictionary). A high level of correlation was found between the statistics of files with similar nature (e.g., two English text files). Such a level of correlation is exploited to compose predefined DHT presets. A matching preset yields the best of both worlds: a close-to DHT compression ratio with close-to SHT compression rate.

SHT and DHT greatly differ in their performance and quality characteristics. The "one-size fit all" approach represented by SHT compromises on the Huffman compression ratio (e.g., quality). The "personal tailoring" approach represented by DHT, on the other hand, compromises on the overall compression rate (e.g. performance). Constructing dynamic dictionaries adds computational overhead and requires a sequential 3-step process that traverses the payload twice. The built-in trade-off between compression ratio and rate is a key usage and implementation decision point. Applications handling internet traffic for example often use SHT because they cannot afford the higher latency and lower bandwidth associated with DHT.

The static and dynamic Huffman encoding methods best reflect the built-in tradeoff between compression rate and ratio. The static Huffman method achieves a lower compression ratio than is possible. This is due to using a fixed encoding table regardless of the content of the input data block. For example, random data and a four letter DNA sequence would be encoded using the same Huffman table.

The dynamic Huffman method does not have as high a compression rate as is possible. Constructing dynamic dictionaries adds computational overhead and worse, requires a sequential three step process that traverses the payload twice. In a first step, the LZ77 algorithm is performed while gathering statistics, including output literal, length and distance frequency. In a second step, statistics are used to construct the literal and length DHT and the distances DHT. Constructing a DHT requires sorting the frequencies, constructing dynamic Huffman trees, transforming it into a canonic DHT and creating a compacted form to be sent alongside the compressed data block. In a third step, the LZ77 output is encoded with the constructed DHTs. The dominant factor degrading compression rate is the second step for small input blocks and the first and third steps for larger inputs. Steps 1 and 3 traverse the payload, hence DHT is a two-pass algorithm.

The deflate algorithm partitions the input stream into blocks and every block is encoded by itself. The two-pass flow requires that intermediate block results be stored which consume several tens of kilobytes, so in software implementations they are likely to overflow to the L2 cache between steps 1 and 3. Hardware implementations, even if they supported DHT, would require either SRAMs which consume chip real estate, caches larger than L1 caches or moving all intermediate results back and forth to memory over the chip interconnect, which is likely to create bottlenecks degrading performance even more.

An explosion in network traffic has forced many edge-of-network applications, such as WAN acceleration, to use hardware accelerators. Hardware accelerators may process an input byte per cycle compared to 100 CPU cycles or so required in software implementations for the same task. These hardware accelerators commonly support dynamic Huffman decompression, but lack that support in the compression path. Settling for static Huffman encoding, as a one-pass algorithm, simplifies the hardware design and enables a high compression rate at the expense of offering a lower compression ratio.

The dictionary selection mechanism of the present invention effectively breaks the built-in tradeoff between compression ratio and rate for both software and hardware implementations. The dictionary selection mechanism achieves high compression rate and ratio leveraging predefined Huffman dictionaries (also known as presets) and provides a mechanism for dynamically speculating which predefined dictionary to select per input data block.

A mechanism is provided for automatically generating a bank of predefined Huffman dictionaries for a set of input data files. Two alternative algorithms are also provided that dynamically and speculatively select a predefined Huffman dictionary from the bank of dictionaries, thereby achieving close to a dynamic Huffman ratio at a static Huffman rate. In addition, an algorithm for implementation a feedback loop for the dynamic selection of the predefined Huffman dictionary is also provided.

In addition, a hybrid heuristic mechanism is provided to achieve (1) a superior compression ratio by using a partially-tailored dynamic Huffman dictionary on one hand, and (2) a superior compression rate by using a single-pass flow as in static Huffman dictionary.

It is noted that using predefined Huffman dictionaries is a compromise between the static and dynamic Huffman methods. The dictionaries are predefined as in static Huffman encoding, but the specific dictionary is selected according to content, resembling dynamic Huffman. Decoding data compressed using static Huffman encoding is straightforward, as the static dictionary is defined within the RFC itself. Other Huffman dictionaries must be conveyed to the decompressing party. In one embodiment, the bank of predefined dictionaries is defined by the customer or applications according to the common data sets they encounter, thus the predefined dictionaries are not part of the standard and must be conveyed over the wire either out of band or in band. In one embodiment, the dictionaries are transmitted in-band, leveraging the RFC defined dynamic Huffman mode. The DHT-based predefined Huffman method transmits the compacted predefined tables as if it was uniquely calculated for the current data block.

Dynamic Huffman encoding defines two Huffman trees, one for literals and lengths and one for distances. Usage of predefined Huffman dictionaries is based on the assumption that similar data types have similar distributions for literals, lengths and distances. Literals in text files for instance will always use many alphabet letters and more vowels than consonants. This phenomenon will remain even after LZ77 repetitions are removed.

It has also been found that length and distance frequencies are also similar between similar file types. Nevertheless, being based on repetitions the frequency distribution is sensitive to two key parameters: the LZ77 implementation and the location of the data being compressed within the stream.

First, the LZ77 configuration used reflects the time and resources needed to find longer repetition than those already found. High effort levels do not spare resources in order to find the longest match possible, while low effort levels settle the first match that crosses a threshold (e.g., 16 B). A hardware implementation, on the other hand, can use a CAM-based approach that provides the longest match possible but consumes die size, and settling on the LZ77 window size.

Second, the location of the data being compressed within the data stream defines the maximal distance a repetition can be found at. Fewer, shorter and closer repetitions are expected when the data stream begins, compared to when the LZ77 algorithm has an entire window size (e.g., 32 KB) of data available in which to look for repetitions. In one embodiment, the mechanism for dynamically selecting a predefined Huffman dictionary targets a fast decision, looking at the first N bytes alone (e.g., 12 KB). Due to the sensitivities in length and especially in distance frequencies, the dynamic selection mechanism is constructed in large part on literals distribution. Note that this is counter intuitive as length distance pairs comprise the majority of LZ77 output.

Figure 2A:
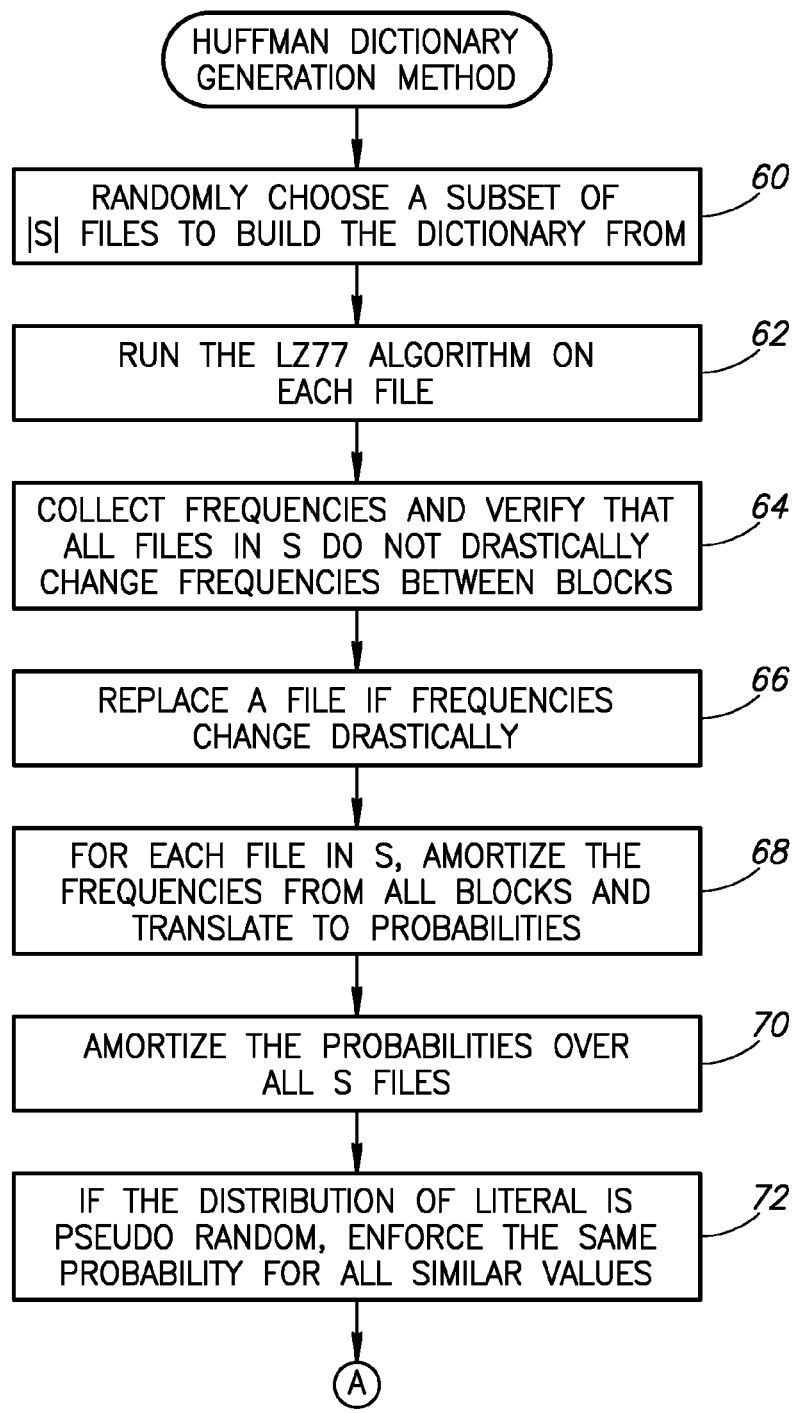
FIGS. 2A and 2B are a flow diagram illustrating a Huffman dictionary generation method in accordance with the present invention.
Figure 2B:
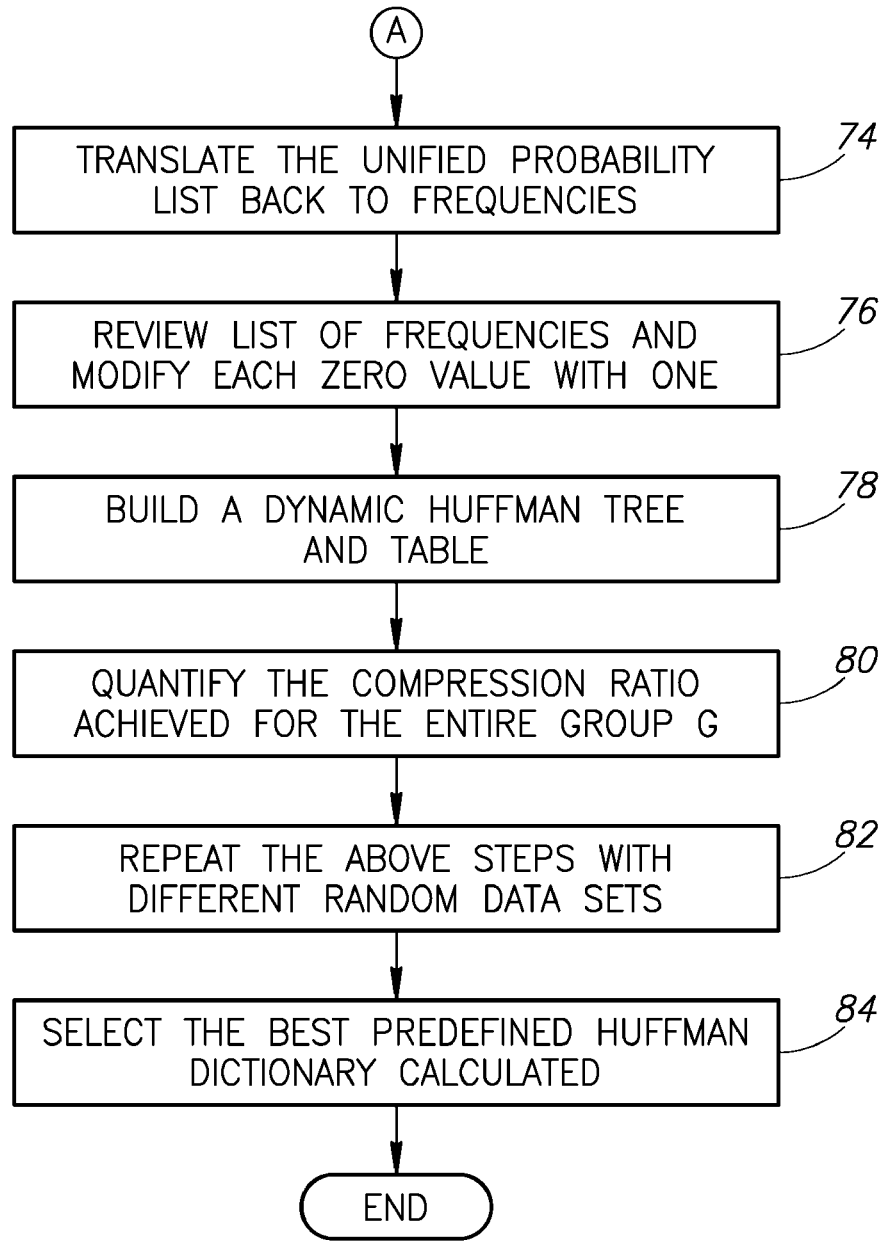

The usage of predefined Huffman dictionaries requires the creation of a bank of dictionaries. A mechanism for automatically creating such a dictionary per a set of benchmarks is described below. In one embodiment, creating a predefined Huffman dictionary is an off-line process that typically is run before the system is built or installed or is run in the background so as to not consume real-time resources. Customers and application can create their own dictionary banks using the automatic bank creation process. A flow diagram illustrating a Huffman dictionary generation method in accordance with the present invention is shown in FIGS. 2A and 2B. The following heuristic builds a predefined Huffman dictionary for a group sample of $|G|$ files (of the same type).

First, a subset of $|S|$ files ($S \subset G$) for building the dictionary is randomly chosen (step 60). Note that alternatively, the file set S can be manually chosen and/or perform the method while stopping after step 78. A repetition removal algorithm such as the LZ77 algorithm is run on each file (step 62). Note that the same repetition removal implementation used in the run time environment is used, e.g., LZ77. Literal frequencies are gathered and for each file in S the correlation between blocks is calculated in order to verify that they do not drastically differ, e.g., do not drastically change their frequencies between blocks (step 64). If a file drastically changes between blocks, it is replaced with another one from G (step 66).

For each file in S, the frequencies from all blocks are amortized and translated to probabilities (step 68). The probabilities are then amortized over all $|S|$ files (step 70). If most none negligible probabilities are very similar, the original per file probabilities are checked. If the distribution of those literals is pseudo random, the same probability is enforced for all similar values (step 72). Note that step 72 is optional as it applies only to certain data types. Compression ratio is improved by smoothing literals frequency counters when they are detected to be substantially uniformly distributed. The amortized over S probability list is then translated back to frequencies (step 74).

The list of frequencies is then reviewed and each zero value is converted into one, so that the final code (tree) is able to represent any input value (step 76). Based on these frequencies, a dynamic Huffman tree and table are then built (step 78). Note that converting zero frequency values to one (or a small non-zero value) enables literals, lengths and distances to be represented that were not encountered in subset S, but which may appear in G.

All files in G are then compressed using the encoding table constructed using the subset S. The amortized compression ratio for the entire group G is then quantified (step 80). The above steps are repeated with different random subsets (step 82) and the best predefined Huffman dictionary calculated is chosen (step 84). Note that the above steps may be repeated a fixed number of times or until no further substantial improvement is seen.

In one embodiment, predefined Huffman dictionaries generated using the mechanism of the present invention achieved close to DHT compression ratio (within 2%). Using the predefined Huffman dictionaries of the invention enables the best of both worlds to be achieved, close to DHT compression ratios at SHT compression rates.

Once the bank of dictionaries is defined, a selection must be made as to which dictionary to use. Selecting an optimum predefined dictionary to use out of a bank of K such dictionaries is important in that encoding data with a sub-optimal predefined Huffman dictionary is likely to degrade the compression ratio.

Note that the mechanism provides two methods of dynamic selection of predefined Huffman dictionaries within a bounded latency. In operation, statistics are gathered on the first LZ-processed N bytes of every input data block wherein it is speculated that the rest of the block will be similar. Introducing an upper decision bound (N) limits both the latency delay and the hardware implementation cost (assuming a hardware accelerator implementation). Two such speculative first N bytes techniques are presented.

Figure 3:
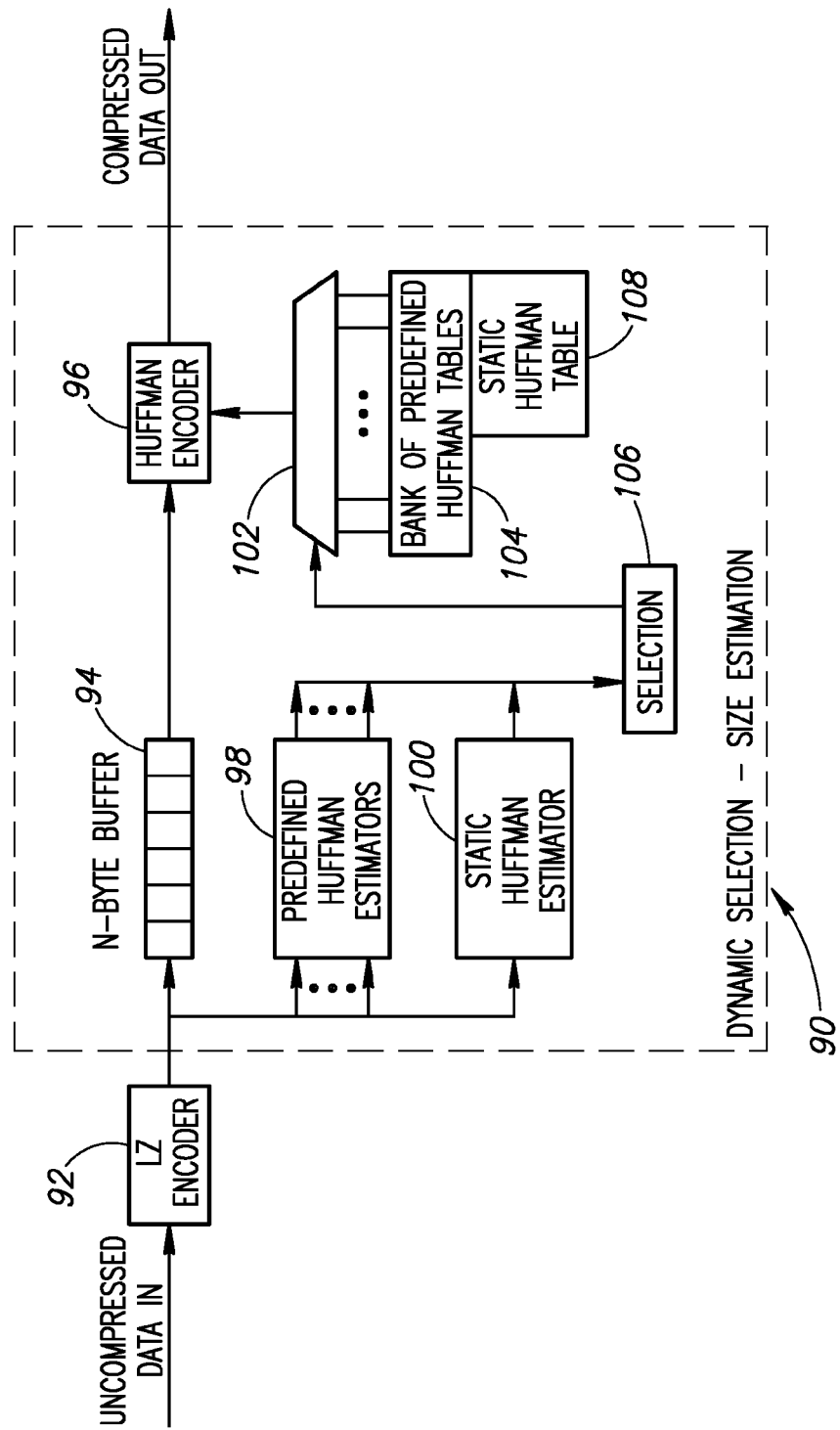
FIG. 3 is a high level block diagram illustrating an example dynamic selection mechanism based on size estimation.

In a first technique, calculations of all the potential output sizes are performed before choosing the minimal one. A high level block diagram illustrating an example dynamic selection mechanism based on size estimation is shown in FIG. 3. The dynamic selection block, generally referenced 90, comprises an N-byte buffer 94 fed by the output of the repetition removal algorithm 92 (LZ77 in this example), Huffman encoder 96 which outputs the compressed data, predefined Huffman estimators 98, static Huffman estimator 100, selection logic block 106, bank of predefined Huffman dictionaries 104, static Huffman table (SHT) 108 and multiplexer 102.

In operation, the output of the repetition removal algorithm (LZ77 component) 92 is fed to K+1 size estimators 98, 100, one per predefined dictionary including one for SHT. Note that a size estimator is not a full Huffman encoder, as it only calculates the number of output bits required, without encoding and saving the output. When the N-byte buffer 94 is full, a selector unit 106 reads all the calculated sizes and chooses the predefined dictionary that generated the minimal output, e.g., the size counters are examined and the dictionary corresponding to the lowest value is considered optimal.

Once a predefined dictionary is selected, the Huffman encoder begins working in parallel to the LZ77 component. This creates a pipeline, in which data is both extracted from the buffer by the encoder and inserted into it by the LZ77 component that continues to byte N+1 and beyond. This process repeats per compression block and can be further optimized so that the delay associated with filling the N byte buffer does not degrade the overall throughput. This requires enhancing the pipeline so that the LZ77 component may work on the next block while the Huffman encoder still processes the current one.

Note that this brute-force dynamic selector method is speculative because only N bytes out of the block's content (LZ77 output) are evaluated. There is no guarantee that the dictionary associated with the minimal size for N will have the minimal size for the entire block. It is speculated (assumed) that the remainder of the compression block has similar characteristics to the first N bytes. Using bigger values of N, makes the method less speculative, but consumes more resources and adds delay. In any case, regardless of the predefined dictionary selected, the Huffman encoding phase begins once a predefined dictionary is chosen. Data is extracted from the buffer 94 by the encoder 96. Data is inserted into the buffer by the LZ77 component that continues to byte N+1 and beyond. This process repeats per input compression block.

Figure 4:
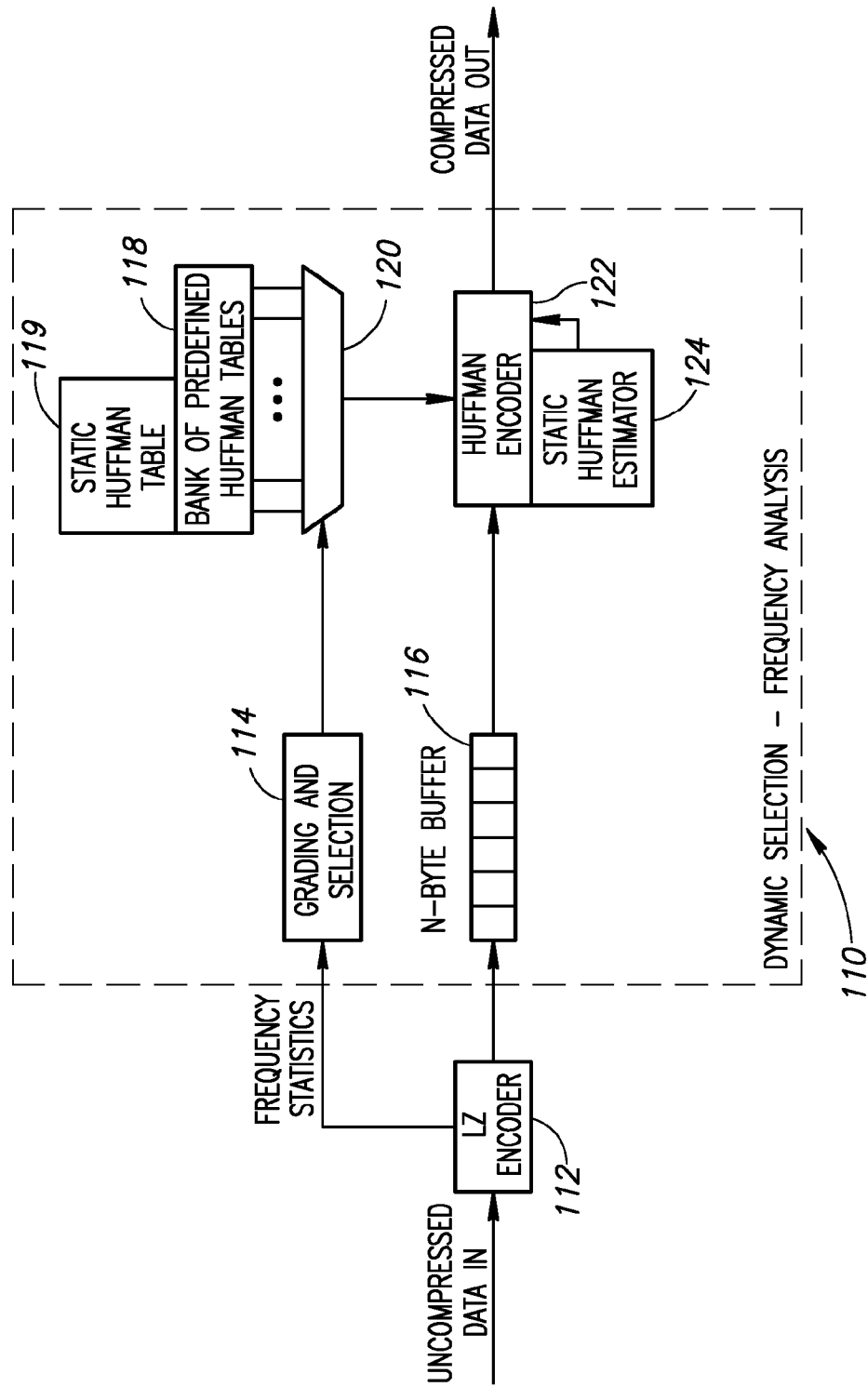
FIG. 4 is a high level block diagram illustrating an example dynamic selection mechanism based on frequency analysis.

In a second technique, a predefined dictionary is chosen based on the observed frequencies over N first bytes of a buffer. A high level block diagram illustrating an example dynamic selection mechanism based on frequency analysis is shown in FIG. 4. The dynamic selection block, generally referenced 110, comprises an N-byte buffer 116 fed from the output of repetition removal algorithm 112 (LZ77 encoder in this example), grading and selection block 114, bank of predefined Huffman dictionary tables 118, static Huffman table 119, multiplexer 120, Huffman encoder for generating compressed output data and static Huffman estimator 124.

In the frequency-based analysis dynamic selector method, the output of the repetition removal algorithm (e.g., LZ77 component) is stored in an intermediate buffer 116. Once N bytes are accumulated, literal, length and distance frequency statistics, which were generated (e.g., counted) in performing the repetition removal (LZ77) algorithm, are passed to a selector (grading circuit) 114. The frequency-based analysis selector chooses a predefined dictionary based on a compatibility grade per predefined dictionary and Huffman encoding begins. In one embodiment a static Huffman size estimator (124) is also used and its purpose is to detect abnormalities, in which SHT outperforms the chosen predefined dictionary for the first N bytes. If this is the case, the compression accelerator may: (1) re-encode the data in the buffer 116 (providing it is still there); or (2) decide to partition the input stream and start a new block, switching to SHT encoding. Note that the latter option does not have to support replay (which degrades performance), but does suffer from a limited compression ratio loss. Leaving the static Huffman estimator 124 out of the mechanism altogether is also an option but the compression ratio loss will be greater in such cases.

Figure 5:
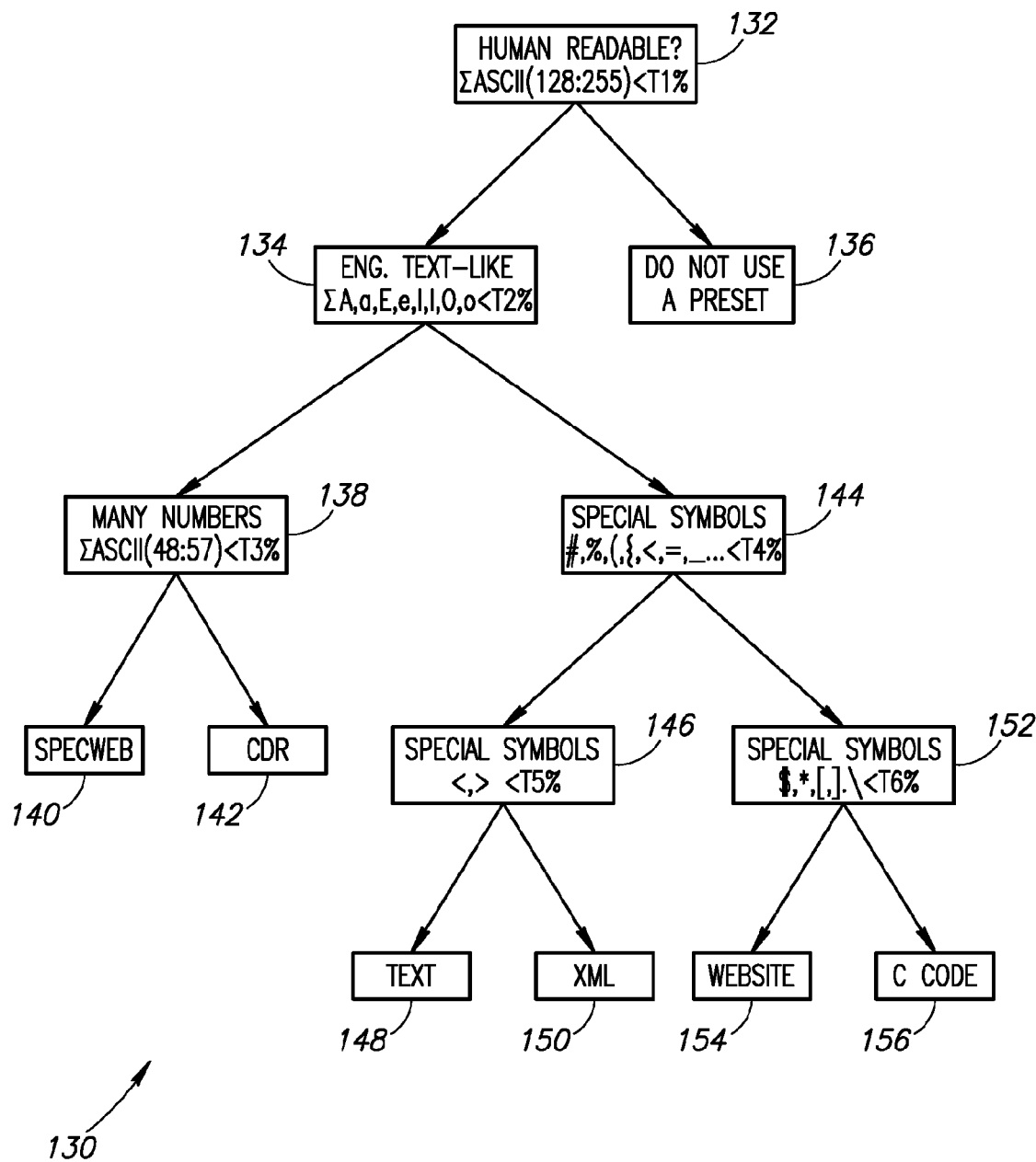
FIG. 5 is a diagram illustrating an example decision tree for choosing a predefined Huffman dictionary.

In one embodiment, the frequency-based analysis logic used is based on a decision tree. A diagram illustrating an example decision tree for choosing a predefined Huffman dictionary is shown in FIG. 5. The frequency-based grading logic shown is provided as an example, as other heuristics are also possible. In this example, six different file types representing six predefined Huffman dictionaries were used: a SpecWeb dictionary 140, Call Data Records (CDR) dictionary 142, text dictionary 148, XML dictionary 150, website dictionary 154 and C code dictionary 156.

The decision process begins at the root and advances towards a leaf. At each node, a subset of the frequency statistics gathered for the first N bytes is tested using a decision metric. The leaf marks the designated predefined dictionary. Exemplifying this, the CDR predefined dictionary will be selected for data samples characterized by: (1) non-human readable ASCII values below threshold T1 (decision block 132), (2) English vowel values below threshold T2 (decision block 134), and (3) number values above threshold T3 (decision block 138). Note that depending on the hardware implementation, an example decision tree for choosing a predefined Huffman dictionary can implement the entire decision in a single cycle.

Other decision blocks include 'do not use a preset' 136, special symbol values below threshold T4 (decision block 144), special symbol values below threshold T5 (decision block 146), special symbol values below threshold T6 (decision block 152).

Using a decision tree for the frequency-based analysis is efficient as it takes log2(K) steps, but requires generating the decision tree. In one embodiment, the decision tree is created manually but in an alternative embedment can be created algorithmically.

Through experimentation, it has been found that given a reasonably long buffer of, for example, 12 KB, both dynamic selection techniques described supra achieve substantially the same compression ratios as the standard.

Figure 6:
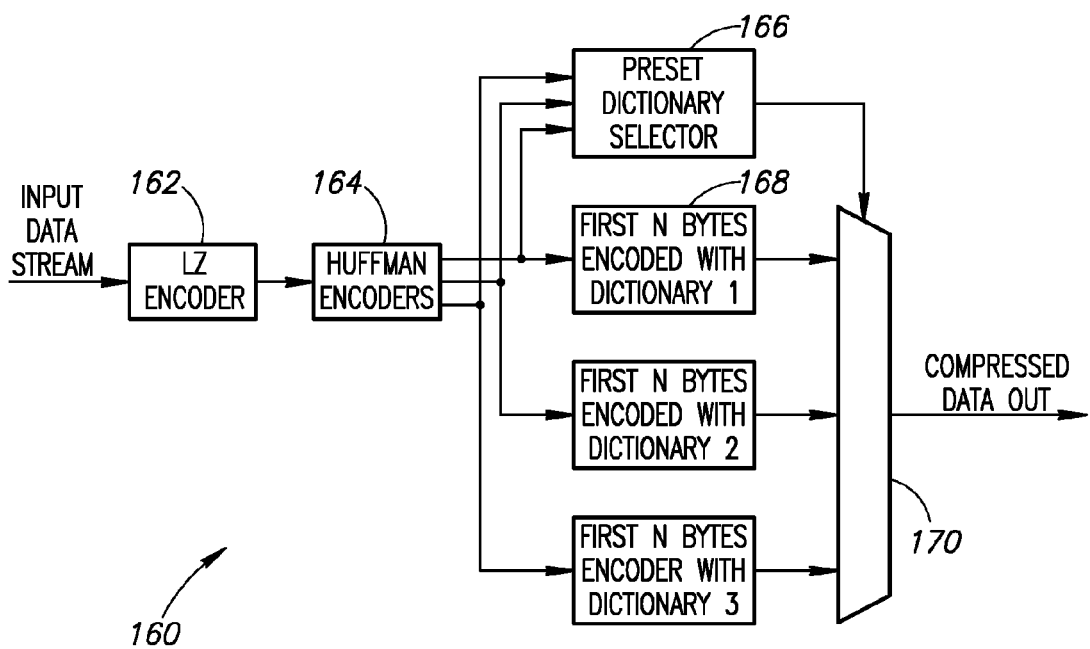
FIG. 6 is a block diagram illustrating an example dynamic selection mechanism incorporating a plurality of N byte buffers.

In an alternative embodiment, multiple N-byte buffers are used in the dictionary selection process. A block diagram illustrating an example dynamic selection mechanism incorporating a plurality of N byte buffers is shown in FIG. 6. The encoder, generally referenced 160, comprises Huffman encoders 164 fed from the output of repetition removal algorithm 162 (LZ77 encoder in this example), preset dictionary selection block 166, bank of N-byte buffers 168 (three are shown for illustration purposes) and multiplexer 170. Compared to the previous embodiment, the N-byte buffer is replaced by multiple N-byte buffers that are located after the Huffman encoders (instead of estimators) and data is encoded using several different dictionaries with the dictionary that achieves the best result is selected. Note that this configuration reduces latency.

Further, a predefined dictionary can be added by software, even if the encoders are implemented as hardware accelerators. In another embodiment, the buffer is removed and the encoder runs on the first-N bytes, makes a decision and restarts the encoding sequence, including LZ, with the selected dictionary.

Alternatively, the preset selector unit is disabled and the preset is explicitly defined by the user. In another embodiment, the selector is hash-based wherein the hash may be defined in numerous ways, for example, but not limited to, by the i most frequent literals and first j zero appearances (e.g., the least frequent literals, whose associated counter is zero but not their value).

In an alternative embodiment, a feedback loop is used to monitor the performance of the preset dictionary currently chosen for encoding. A feedback loop is introduced since data streams for a file may change over time. Consider that the majority of data streams share common statistics across data blocks. Take for example the first and the second 32 kB chunks of an English text book and they both have English text characteristics. The characteristics of some data, however, change over time. For example, a '.tar' file containing a mixture of data types. Another example is data saved by applications, such as Microsoft .xls, in which measurements indicate that the 1st and 2nd chunks are not similar at all. Processing the 2nd chunk of data, using a preset chosen to match the content of the first chunk, yields a poor compression ratio.

In order to be able to compensate for changing input stream data between blocks, the selector generates decisions on a per block basis, even though many of the blocks may belong to the same data stream. The feedback loop is operative to take advantage of what it has learned from one block (e.g., bad preset selected, poor DHT reuse or approximation etc.) and apply that knowledge to the next block. Note that one possible output of the feedback loop is to use a lower threshold for closing blocks and opening new ones (e.g., for xls-like files).

Figure 7:
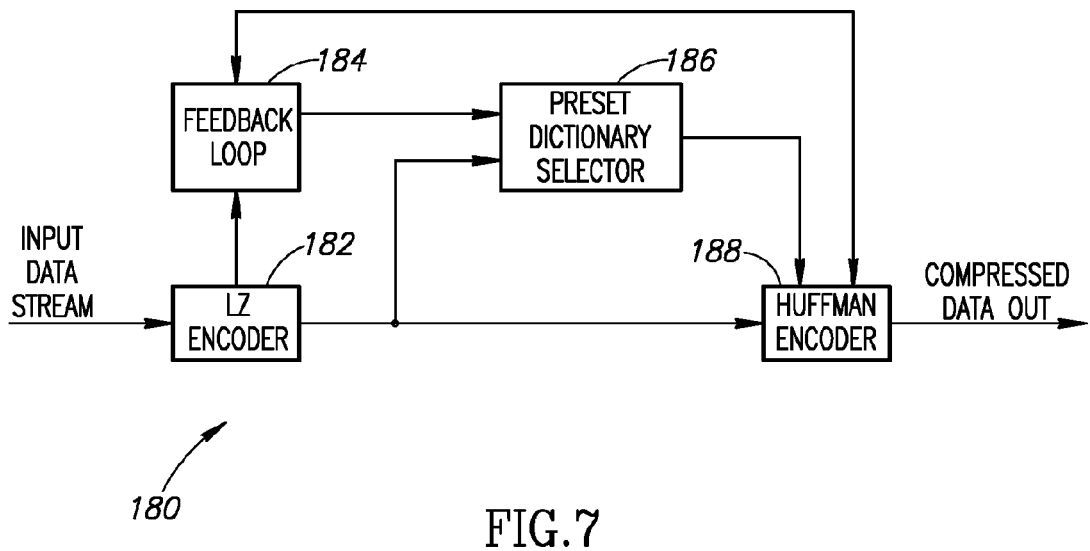
FIG. 7 is a block diagram illustrating a first example dynamic selection mechanism incorporating a feedback loop.

A block diagram illustrating a first example dynamic selection mechanism incorporating a feedback loop is shown in FIG. 7. The mechanism, generally referenced 180, comprises a repetition removal coder (e.g., LZ77 encoder) 182, feedback loop block 184, preset dictionary selector 186 and Huffman encoder 188.

The mechanism of the invention comprises a feedback loop that monitors the ongoing performance of the preset currently selected for use by the hardware accelerator. The feedback loop monitors the performance of the preset versus other possible presets (including static Huffman) for each block of data in the input data stream. If it detects that the selected preset was the wrong speculative choice or is no longer optimal, it generates a recommendation to begin a new block and replace the previously speculated preset with a better one. The new preset is used to encode future blocks and can even be used to re-encode the current data block. Furthermore, it may lower the block size threshold belonging to this stream (e.g., to N bytes).

The actual mechanism used by hardware accelerator to select the preset is implementation specific and not critical to the invention. In one embodiment, the first N-bytes of the data stream are analyzed. In another embodiment, encoding always begins with static Huffman for the first block and the feedback loop makes the choice for all following blocks. Note that the feedback loop implementation typically consumes a modest hardware area since, in one embodiment, comprises a set of estimators and comparators. In another embodiment, the feedback loop is used to recover from other speculative heuristics that use ready-made DHTs, where the DHT is calculated for the first block and then reused for the remainder of that data stream.

One advantage of using the feedback loop of the invention is that the mechanism is functionally a compression ratio optimization to methods that leverage presets. In one embodiment, the feedback loop logic operates in the background (concurrently to running LZ). It does not degrade performance as long as the feedback loop information is used to improve the compression ratio of subsequent data blocks. Using the information to re-encode the current block, however, increases latency, but it is a decision which has a configurable threshold which users can configure according to the particular implementation, desired compression rate and ratio requirements.

Moreover, using the feedback loop lowers the penalty for choosing a suboptimal preset because it only affects the first data block and even that first block is made smaller once the speculation is proven to be wrong. Thus, the preset selector can be made simpler, up to the point in which it always chooses Static Huffman for the first block. Alternatively, it provides additional historical information to preset selectors that re-choose a preset every data block, assisting them in choosing more optimal presets.

The feedback loop is operative to monitor the performance of the currently selected preset and compare it to static Huffman and other presets in several ways. Two example ways are illustrated in FIGS. 8 and 9, as described infra.

Figure 8:
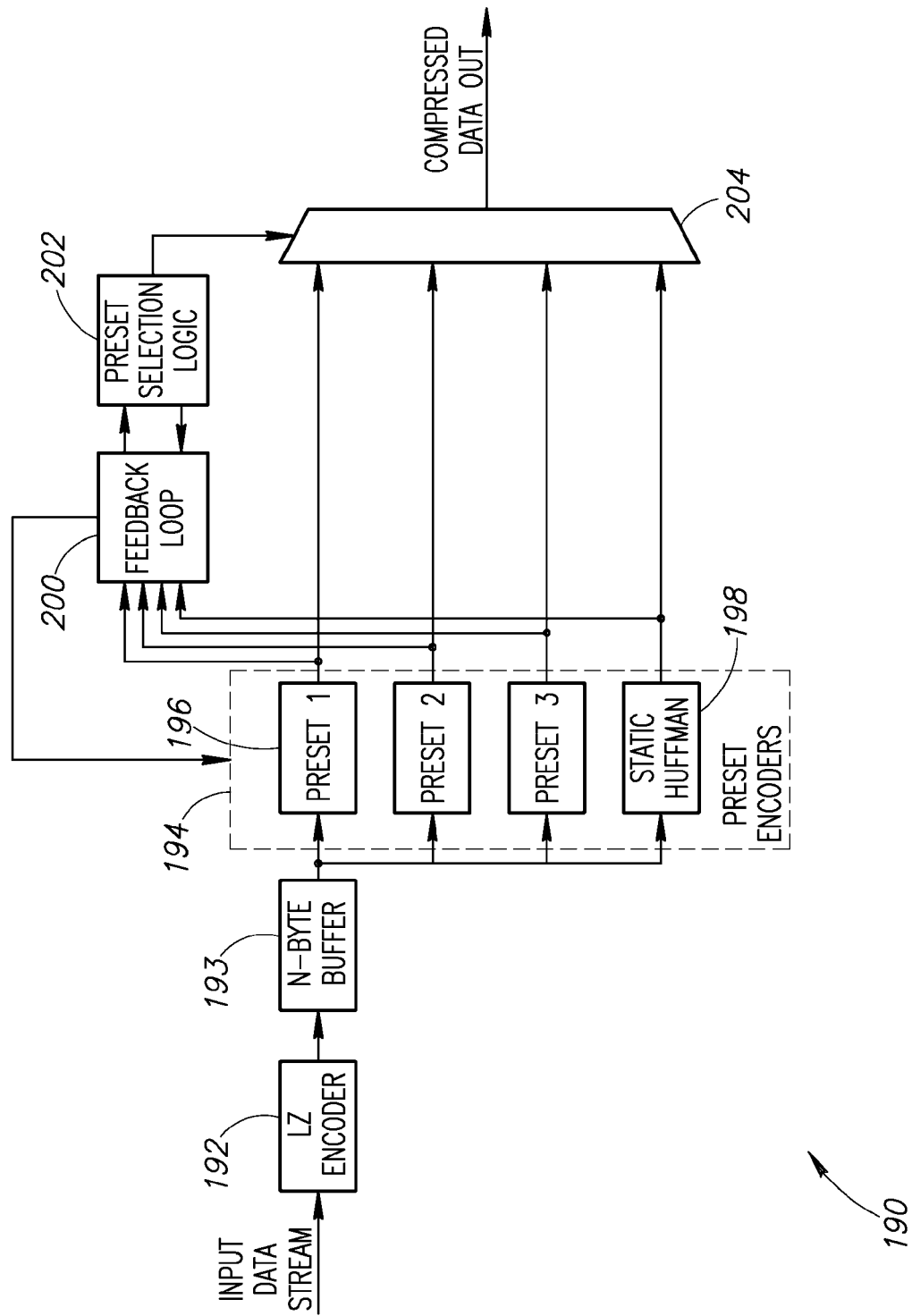
FIG. 8 is a block diagram illustrating a second example dynamic selection mechanism incorporating a feedback loop.
Figure 9:
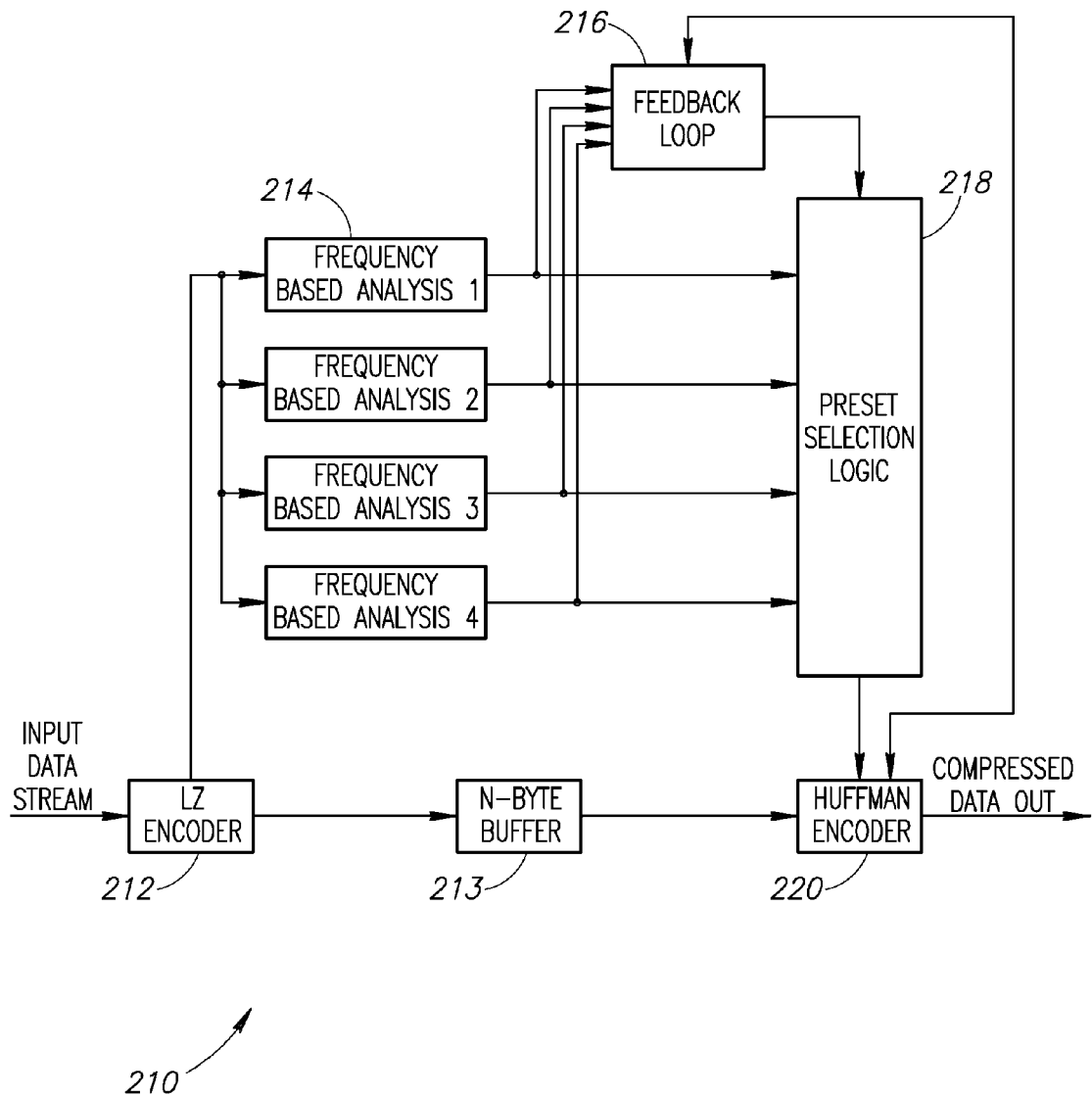
FIG. 9 is a block diagram illustrating a third example dynamic selection mechanism incorporating a feedback loop.

A block diagram illustrating a second example dynamic selection mechanism incorporating a feedback loop is shown in FIG. 8. The mechanism, generally referenced 190, comprises a redundancy removal coder (LZ77 encoder) 192, N-byte buffer 193, preset encoders 194, feedback loop block 200, preset selection logic 202 and multiplexer 204. The preset encoders 194 comprises a plurality of presets 196 and static Huffman 198.

The mechanism comprises several preset encoders 194 (preset 1, 2, 3, etc.) and a Static Huffman encoder. The preset selector 202 is operative to choose which preset encoder should be connected to the compressed data output stream via multiplexer 204. The feedback loop 200 receives statistics (the length of the symbols) from each of the preset encoders and generates a sum for each encoder. The sums are periodically compared and if the lowest one is not the preset currently being used and the difference is larger than some threshold bytes, the feedback loop 200 sends a notification to the preset encoder 194 to end the current block and start a new one. Another notification is sent to the preset selection logic 202 that includes the identity of the optimal preset encoder to be used on the next data stream block.

If the currently used preset is not optimal, in one embodiment the system discards the encoded data of the current data block and re-encodes it using the newly found optimal preset. Alternatively, the system automatically selects Static Huffman encoding for the first block of data and uses the information gathered by the feedback loop to select the preset encoder to be used with subsequent data blocks.

A block diagram illustrating a third example dynamic selection mechanism incorporating a feedback loop is shown in FIG. 9. The mechanism, generally referenced 210, comprises a redundancy removal coder (LZ77 encoder) 212, N-byte buffer 213, Huffman encoder 220, a plurality of frequency-based analysis blocks 214 (four shown for illustration purposes), feedback loop block 216 and preset selection logic 218.

Note that in one embodiment, preset selection generates a decision after N bytes but the feedback loop continues to monitor (e.g., at 2N, 3N, etc. intervals). In addition, the preset selector and the feedback loop can utilize difference approaches. For example, the preset selector uses frequency-based analysis while the feedback loop uses an SHT estimator (similar to SHT estimator 124 (FIG. 4).

This mechanism is similar to that of FIG. 8 with the difference being that the feedback loop 216 employs multiple signature functions 214 on the statistics of the current input data block, rather than implementing multiple encoders as is done in FIG. 8 or size estimators. This mechanism, however, may be less accurate, but more space efficient when the bank of presets is large.

Like in the mechanism of FIG. 8, if the currently used preset is not optimal, in one embodiment, the system discards the encoded data of the current data block and re-encodes it using the newly found optimal preset. Alternatively, the system automatically selects Static Huffman encoding for the first block of data and uses the information gathered by the feedback loop to select the preset encoder to be used with subsequent data blocks.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A method of selecting a Huffman dictionary from a bank of predefined Huffman dictionaries, said method comprising:
   selecting for encoding of input data, a dictionary from said bank of predefined dictionaries in accordance with a predefined criteria;
   encoding the input data by an encoder, in accordance with the selected dictionary;
   in parallel to performing the encoding, estimating the compression performance of other predefined dictionaries in the bank on the encoded input data, without actually encoding the input data in accordance with the other predefined dictionaries;
   comparing the estimated performance of the selected dictionary to the estimated performance of the other predefined dictionaries; and
   switching to encoding the input data in accordance with a different selected dictionary if such switching is determined to be advantageous based on the comparison.

2. The method according to claim 1, wherein said selecting comprises analyzing the first N-bytes of said input data stream and wherein the encoding in accordance with the selected dictionary is performed on more than the first N-bytes.

3. The method according to claim 1, wherein said selecting comprises always beginning with a predetermined dictionary, regardless of the input data.

4. The method according to claim 1, wherein said predefined criteria comprises:
   receiving the output of a repetition removal algorithm applied to an input data stream and storing said output in a buffer;
   calculating the output bit size required corresponding to predefined Huffman dictionaries in said bank of dictionaries; and
   comparing the calculated sizes and selecting the predefined dictionary corresponding to the smallest output size.

5. The method according to claim 1, wherein said bank of predefined dictionaries comprises a static Huffman table.

6. The method according to claim 1, further comprising repeating said steps of selecting, encoding, estimating, comparing and switching for each block of input data.

7. The method according to claim 1, wherein switching to encoding the input data in accordance with a different selected dictionary comprises discarding encoded data of a current data block and re-encoding it with the different selected dictionary.

8. The method according to claim 1, wherein switching if such switching is determined to be advantageous comprises:
   measuring the difference in compression ratio between the estimated compression ratio of the different selected dictionary and that achieved by the currently selected predefined dictionary; and
   switching if the difference is greater than a threshold.

9. The method according to claim 1, wherein encoding the input data is performed by a hardware encoder.

10. The method according to claim 1, wherein selecting the dictionary comprises selecting speculatively, such that the selected dictionary does not necessarily achieve a best compression for the input data compressed in accordance with the selected dictionary.

11. A method of implementing a feedback loop for selecting a preset Huffman dictionary from a bank of predefined Huffman dictionaries for use in a hardware data encoder, said method comprising:
   speculatively selecting for encoding of input data, a dictionary from a bank of predefined dictionaries, in accordance with a predefined criteria by analyzing a predetermined portion of the input data with the dictionaries of the bank of dictionaries;
   encoding the input data by an encoder, using the selected dictionary;
   monitoring the performance of the selected dictionary as compared to other dictionaries in the bank; and
   switching to encoding the input data in accordance with a different selected dictionary if such switching is determined to be advantageous based on the monitoring.

12. The method according to claim 11, wherein monitoring the performance of said selected dictionary comprises:
   summing the length of symbols for each dictionary;
   comparing the sums generated for each dictionary at the end of an input block; and
   if the dictionary associated with the lowest sum is not the currently selected dictionary, then setting said encoder to use the dictionary associated with said lower sum.

13. The method according to claim 11, further comprising repeating said steps of selecting, encoding, monitoring, and switching if advantageous for each input data block.

14. The method according to claim 11, wherein after switching, the encoding uses the new dictionary beginning from a next input data block.

15. The method according to claim 11, further comprising discarding encoded data of a current data block and re-encoding it with the new different selected dictionary.

16. The method according to claim 11, further comprising:
measuring the difference in compression ratio between the highest compression ratio in the monitoring and that achieved by the currently selected predefined dictionary; and
if the difference is greater than a threshold, discarding encoded data of a current data block and re-encoding it with the new optimal predefined dictionary.

17. A feedback loop for selecting a preset Huffman dictionary from a bank of predefined Huffman dictionaries for use in a hardware data encoder, comprising:
a repetition removal encoder operative to count the frequency of appearances of literals, lengths and distances in an input data block;
a plurality of preset encoders and a static Huffman encoder;
a preset selector operative to speculatively choose one of said preset encoders;
a feedback loop circuit operative to count the length of symbols output by each preset encoder; and
if the preset encoder corresponding to the lowest length is not the currently selected encoder, then end current block and said preset selector operative to change its choice of optimal preset encoder to the preset encoder corresponding to the lowest length,
wherein said feedback loop is operative to measure the difference in compression ratio between the optimal compression ratio and that achieved by the currently selected preset encoder, and if the difference is greater than a threshold, discard encoded data of a current data block and have it re-encoded with the new optimal preset encoder.

18. The feedback loop according to claim 17, wherein said feedback loop is operative to automatically select static Huffman encoding for the first block of data and use the information collected by said feedback loop to select the preset encoder for the next input data block.

19. A data encoder, comprising:
a repetition removal encoder operative to receive input data, encode the data by removing repetitions and representing the data by literals lengths and distances, and count the frequency of appearances of literals, lengths and distances in the encoded data;
a selector operative to choose one of a plurality of predefined Huffman dictionaries to be used in encoding the output of the repetition removal encoder;
a Huffman encoder operative to encode the output of the repetition removal encoder, using the dictionary selected by the selector; and
a feedback loop circuit operative to apply multiple predefined analyzing schemes on the data output from said repetition removal encoder, without actually encoding the data output in accordance with other predefined dictionaries, so as to evaluate the efficiency of the selected dictionary currently used by the Huffman encoder;
wherein the selector is operative to change its choice of dictionary responsive to output from the feedback loop circuit.

20. The data encoder according to claim 19, wherein said Huffman encoder is operative to discard encoded data of a current data block and have it re-encoded with a new dictionary, responsive to a change in the dictionary selected by the selector.

21. The data encoder according to claim 19, wherein said selector is operative to choose static Huffman encoding for the first block of data, regardless of the input data.

22. The data encoder according to claim 19, wherein the selector is operative to choose a dictionary speculatively, such that the selected dictionary does not necessarily achieve a best compression for the input data compressed in accordance with the selected dictionary.

23. The data encoder according to claim 19, wherein the selector is operative to choose a dictionary based on the first N bytes of an input longer than N bytes.

24. The data encoder according to claim 19, wherein the feedback loop circuit is operative to evaluate the efficiency of the selected dictionary using the count of frequency of literals, lengths and distances from the repetition removal encoder.

* * * * *